United States Patent [19]

Leedy

[11] Patent Number: 5,008,672

[45] Date of Patent: Apr. 16, 1991

[54] SIGNAL CONVERSION APPARATUS WHICH REDUCES QUANTIZATION ERRORS FOR TELECOMMUNICATIONS APPLICATIONS

[75] Inventor: Harold G. Leedy, Westminster, Colo.

[73] Assignee: AT&T Bell Laboratories, Murray Hill, N.J.

[21] Appl. No.: 291,728

[22] Filed: Dec. 29, 1988

[51] Int. Cl.$^5$ .................. H03M 1/06; H03M 1/34; H03M 1/00; H03M 1/80

[52] U.S. Cl. .................. 341/138; 341/118; 341/200; 341/155; 341/158; 341/153

[58] Field of Search ............... 341/138, 165, 155, 154, 341/144, 118, 200, 153

[56] References Cited

U.S. PATENT DOCUMENTS

| | | | |
|---|---|---|---|
| 3,577,194 | 5/1971 | Beall | 341/165 |
| 3,735,392 | 5/1973 | Kaneko | 341/165 X |
| 3,905,028 | 9/1975 | Wintz et al. | 341/138 |
| 3,997,892 | 12/1976 | Susset | 341/138 X |
| 4,021,800 | 5/1977 | Katagiri et al. | 341/165 X |
| 4,142,185 | 2/1979 | Gordon | 341/165 X |

Primary Examiner—J. R. Scott
Assistant Examiner—Sharon D. Logan
Attorney, Agent, or Firm—David R. Padnes

[57] ABSTRACT

Signal conversion apparatus transforms an input signal having a value falling in one of a plurality of ranges into an output signal whose value varies for each different range. All of the output signal values corresponding to the plurality of ranges form an ordered set. The output signal values in this set are related to one another such that the value of any output signal is equal to the immediately preceding output signal value multiplied by a predetermined factor which is a constant for at least a plurality of consecutive output signal values. Use of such a relationship between output signal values advantageously reduces quantization errors in certain telecommunications applications and can be embodied within analog-to-digital, digital-to-analog and digital-to-digital signal conversion apparatus.

17 Claims, 4 Drawing Sheets

POSSIBLE LOSS
CONFIGURATIONS

DIGITAL LOSS WITH UNIFORM PCM
(6db DIGITAL LOSS)

SIGNAL CONVERSION APPARATUS WHICH REDUCES QUANTIZATION ERRORS FOR TELECOMMUNICATIONS APPLICATIONS

TECHNICAL FIELD

The present invention relates to digital communications and, more particularly, to apparatus which reduces the quantization error associated with signal conversion in certain telecommunications applications.

BACKGROUND OF THE INVENTION

Signal conversion apparatus converts an input signal in a first form to an output signal in a second form. The first and second forms may each be either analog or digital. Accordingly, the conversion apparatus may provide analog-to-digital conversion and vice versa, digital-to-digital conversion, or analog-to-analog conversion. This invention relates to apparatus which provides any of these conversions except for the last. In other words, the form of the input and/or output signal is digital.

In many telecommunications applications, analog signals are quantized into discrete digital signal levels. The analog signal may represent virtually any information such as voice, data, facsimile, video and the like. Quantization involves assigning the amplitude of an analog signal sample to one of a number of discrete output levels. This process inherently produces "rounding-off" or quantization errors which result from the association of a continuum of amplitude values between some prescribed limits with a far smaller number of discrete digital signal levels.

The above errors are particularly significant within communications networks in which digital loss pads are routinely inserted within circuits to attenuate echoes. Such loss pads, of course, also attenuate the information signal. However, as the level of the information signal far exceeds that of the objectionable echo and the minimally acceptable information signal levels, the use of such pads provides an inexpensive alternative to the use of echo cancellers and suppressors in circuits less than some predefined length. This circuit length varies but is typically less than 1000 miles.

The circuit loss inserted will vary with the particular circuit application and each circuit is engineered to conform to a particular loss plan. Moreover, when circuits constructed in accordance with different loss plans are interconnected together, it is often necessary to insert some predetermined amount of gain into the information signal.

The use of loss or gain pads produces an additional quantization error for the information signal inasmuch as the quantized signal, when altered by the predefined gain or loss, may not exactly correspond to one of the discrete digital signal levels. Hence, another rounding-off error is introduced. This additional quantization error, while introducing additional distortion in voice applications, can produce a particularly objectionable level of errors in data, video and facsimile applications. This is particularly true in applications where a customer modem converts digital information into an analog signal for transmission through a communications path which interconnects the customer to the rest of the communications network. In such applications, the attenuation of the information and echo signals limits the ability of an echo suppressor or canceller in the modem to correctly identify these signals and the transmission error rate dramatically increases. Furthermore, inasmuch as the additional quantization error varies and is unpredictable, present attempts to solve this problem have not been successful.

SUMMARY OF THE INVENTION

What I have realized is that the additional quantization error produced by the insertion of discrete levels of loss or gain in digital communications circuits can be eliminated through the use of digital signals representative of quantization levels which follow a relationship that is linear in a logarithmic sense. That is, any quantization level in the ordered set formed by all such levels is equal to the immediately preceding quantization level multiplied by a scalar value. This scalar value is either fixed for the entire set of quantization levels or is fixed for any subset of consecutive quantization levels and is a multiple of this fixed value for other subsets. In either case, if the digital losses or gains to be inserted correspond to multiples of the scalar value or values, the insertion of such loss or gain will not produce any quantization error as the digital signal after insertion of the gain or loss will always exactly correspond to one of the quantization levels.

This relationship between the quantization levels can be incorporated into any apparatus which performs analog-to-digital conversion and vice versa. In addition, this relationship between quantization levels can be used to define the relationship between either the input or output levels of a coder which maps one digital signal into another digital signal. Use of such conversion apparatus would be desirable in applications which utilize well-known $\mu$ or A-law codecs and it is desired to incorporate the present invention without removing such codecs.

DETAILED DESCRIPTION

Figure 1:
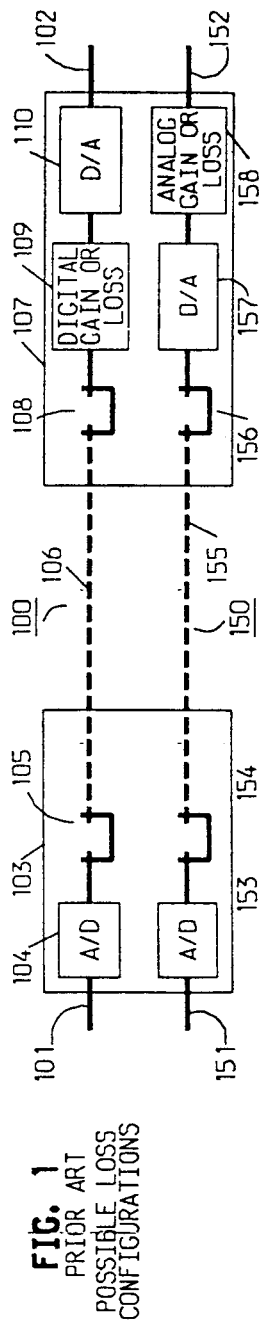
FIG. 1 is a block-schematic diagram of illustrative communications systems which utilize gain or loss pads.

The additional quantization error eliminated by the present invention arises in a variety of telecommunications applications. Two illustrative applications are shown in FIG. 1.

In one application, communications network 100 couples information between customers who are connected to the network via leads 101 and 102. The information received on lead 101 and ultimately appearing on lead 102 is represented by an analog signal. Within central office 103, the analog signal on lead 101 is converted into a digital signal by analog-to-digital (A/D) converter 104 and then selectively coupled to an appropriate outgoing communications path via switch 105. This outgoing path, represented by dotted line 106, may be a single communications link or a myriad of links including other central offices. In either case, the information from lead 101 eventually arrives at central office 107 where it is coupled through switch 108, digital gain or loss pad 109 and digital-to-analog (D/A) converter 110 and thence to lead 102. Switch 108 provides the appropriate switching function so that the information on lead 101 is eventually coupled to lead 102. Digital gain or loss pad 109 provides some predetermined dB gain or loss in accordance with well-known circuit design standards. Loss is typically inserted by pad 109 to attenuate objectionable echoes. The amount of loss is determined by well-known standards or "loss plans," such as the "fixed" loss plan or "via net" loss plan, and generally varies for any plan with the specific type and length of the facilities interconnected by any switch. At other times, pad 109 provides some gain and this most typically arises when circuits designed using different loss plans are serially connected. In addition to providing the necessary gain or loss, pad 109 also maps the attenuated or amplified digital signal into one of the discrete number of digital signals used by A/D converter since only these discrete levels can be interpreted by D/A converter 110. Converter 110 receives the digital output of pad 109 and transforms this digital signal into an attenuated version of the analog waveform coupled on lead 101.

In another application, communications network 150 couples analog information received from lead 151 and transmits this information to lead 152. As with communications network 100, the analog information is converted to a digital format via A/D converter 153 and switched to an appropriate outgoing communications path via switch 154. As before, this outgoing path, represented by dotted line 155, represents at least one communications link. Central office 107 provides the same switching and D/A converter function performed for network 100, via switch 156 and converter 157. Indeed, the only functional difference between networks 100 and 150 is that the appropriate gain or loss insertion to attenuate echoes is performed on an analog signal in network 150 via analog loss pad 158.

While analog gain or loss pad 158 does not introduce any quantization errors because the signal amplitude which is amplified or attenuated has continuous values, there are several disadvantages in utilizing analog gain or loss insertion. First, the amount of gain or loss required varies with the actual trunk or loop interconnected by any switch in the communications network. The optimum place, therefore, to provide the gain or loss is at the switch because the switch controller knows the interconnection provided and can add the required gain or loss to the switched signal via software. The majority of switches today are digital and the use of an analog gain or loss device at a digital switch requires surrounding the analog device with A/D and D/A converters at an additional expense. Second, the analog gain or loss device is adjustable "hardware" as opposed to a software implemented digital gain or loss device. Such adjustable hardware adds complexity to the administration of the network and may require dispatching personnel to adjust the gain or loss setting and this, in turn, introduces the possibility of adjustment errors. Finally, the required accuracy on the necessary gain or loss can, at times, be difficult to achieve with an analog device. As a result, the cost and ease of both implementation and administration strongly favor directly applying gain or loss to a digital signal, such as shown in network 100.

With network 100, this insertion of digital loss or gain creates a quantization error which is in addition to the quantization error inherent in the analog-to-digital signal conversion process.

Before proceeding further, it is desirable to review some basic principles. The process of analog-to-digital conversion involves sampling an analog waveform and quantizing the amplitude of each sample to one of a discrete number of signal levels. The output level to which a sample is quantized is generally the output level closest in amplitude to the amplitude of the analog signal sample. Each of these output levels is assigned a unique code word which is transmitted. In the inverse process, i.e., digital-to-analog conversion, the digital code word is converted back into the analog signal sample and, if a sufficient number of samples per unit time were digitally coded, the original analog waveform can be reconstructed. The process of assigning samples of the analog waveform to one of a number of discrete number of signal levels inherently produces a quantizing or "rounding off" error since samples having amplitudes over a finite range are all assigned to the same signal level. In addition, in the process of introducing signal gain or loss, an additional quantization error is produced. At times, this additional quantization error can reduce the quantization error originally produced by the A/D conversion process, but this additional quantization error often increases the initial quantization error to a degree which interferes with the operation of the telecommunications circuit. For example, for an A/D converter incorporating either $\mu$ or A-law, the distortion signal is at best 35.5 to 39.3 dB below the information signal. With the introduction of the additional quantization error produced by the insertion of loss or gain, the distortion level may be at best only 30.9 to 36.1 dB below the information signal. The decrease in the signal distortion ratio can, for example, interfere with the operation of echo cancellers within modems which are connected to the telecommunications network by customers.

Figure 2:
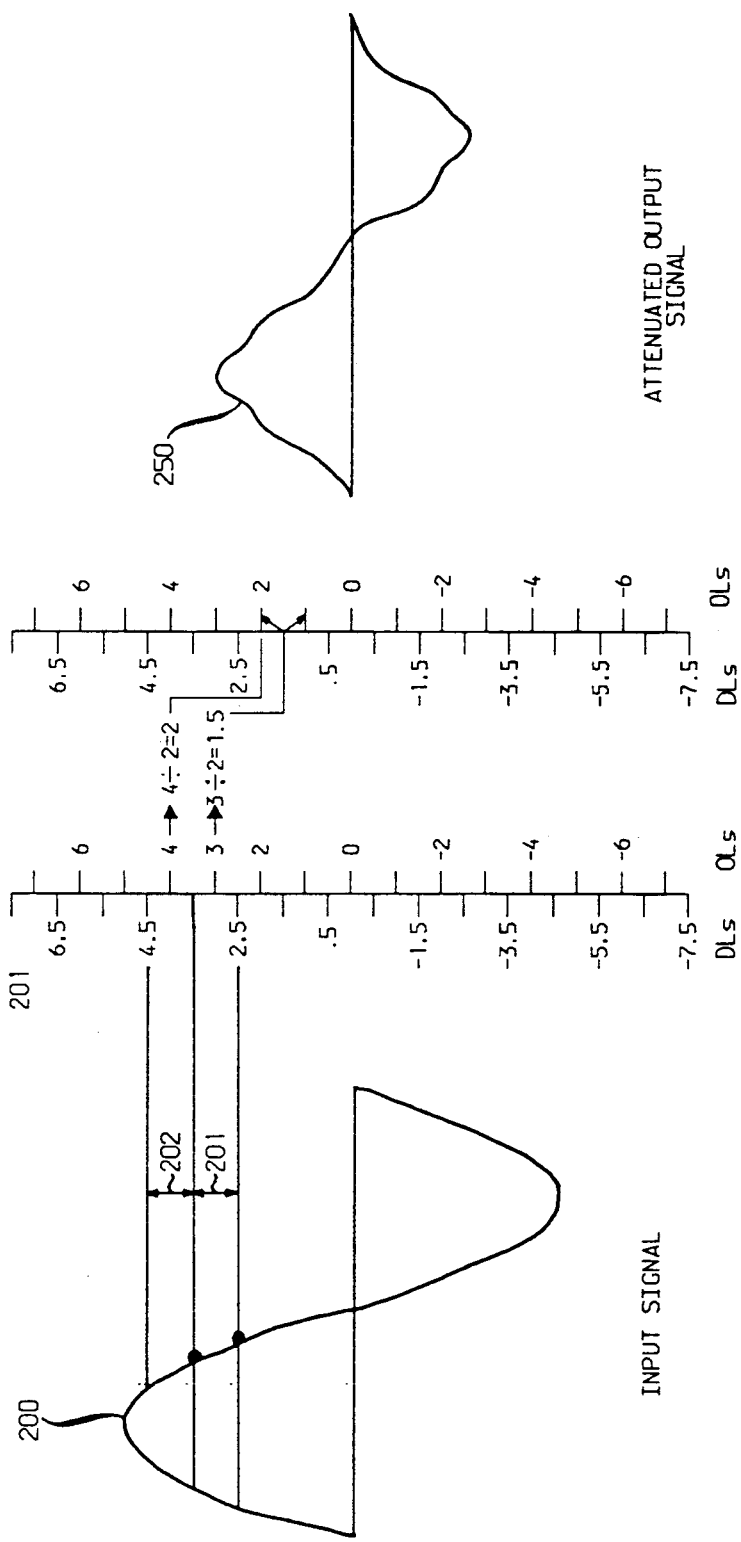
FIG. 2 is a graphical illustration of the effects of the additional quantization error produced by the use of the digital gain or loss pads in FIG. 1.

Refer now to FIG. 2, which illustrates how the additional quantization error arises. An analog input signal waveform 200 is shown which is to be converted into a series of digital code words. An illustrative collection of discrete digital signal levels available for the quantization process is shown by bar graph 201. These values are $-7, -6, -5 \ldots +6$, and $+7$ and are shown on the right-hand side of graph 201 as the output levels or OLs. Each of these output levels will be assigned to represent an analog signal sample whose amplitude lies in a given range extending between two decision levels (DLs). These decision levels are shown on the left-hand side of graph 200 and are $-7.5, -6.5 \ldots +6.5, +7.5$. The pair of decision levels associated with any given output level are the two decision levels closest to the output level. For example, the decision levels for an output level of $-2$ are $-1.5$ and $-2.5$. Accordingly, an analog signal sample whose amplitude lies in region 201 of waveform 200, i.e., between a value of $+2.5$ and $+3.5$, will be quantized to a $+3$ output level. Now, assume that a 6 dB loss is to be provided. This dB loss is equivalent to dividing the digital signal level of $+3$ by two. However, the resulting value of 1.5 is not one of the available digital signal levels and, as a result, an additional quantizing error is introduced by the assignment of the 1.5 value to either a +1 or a +2. It will be noted that the insertion of some dB loss does not always introduce an additional quantizing error. For example, samples of the input analog signal waveform analog lying in region 202, i.e., between decision level 3.5 and 4.5, are quantized to a +4 output level. The introduction of 6 dB of loss to this digital output level results in a value of +2 which exactly corresponds to one of the possible digital output levels. The result of this second quantizing error is that the originally received analog signal, when eventually reconstructed, is not only attenuated but includes random distortion. Waveform 250 is the analog signal which is reconstructed from the digital representations of waveform 200 after such representations are attenuated with 6 dB of loss.

Figure 3:
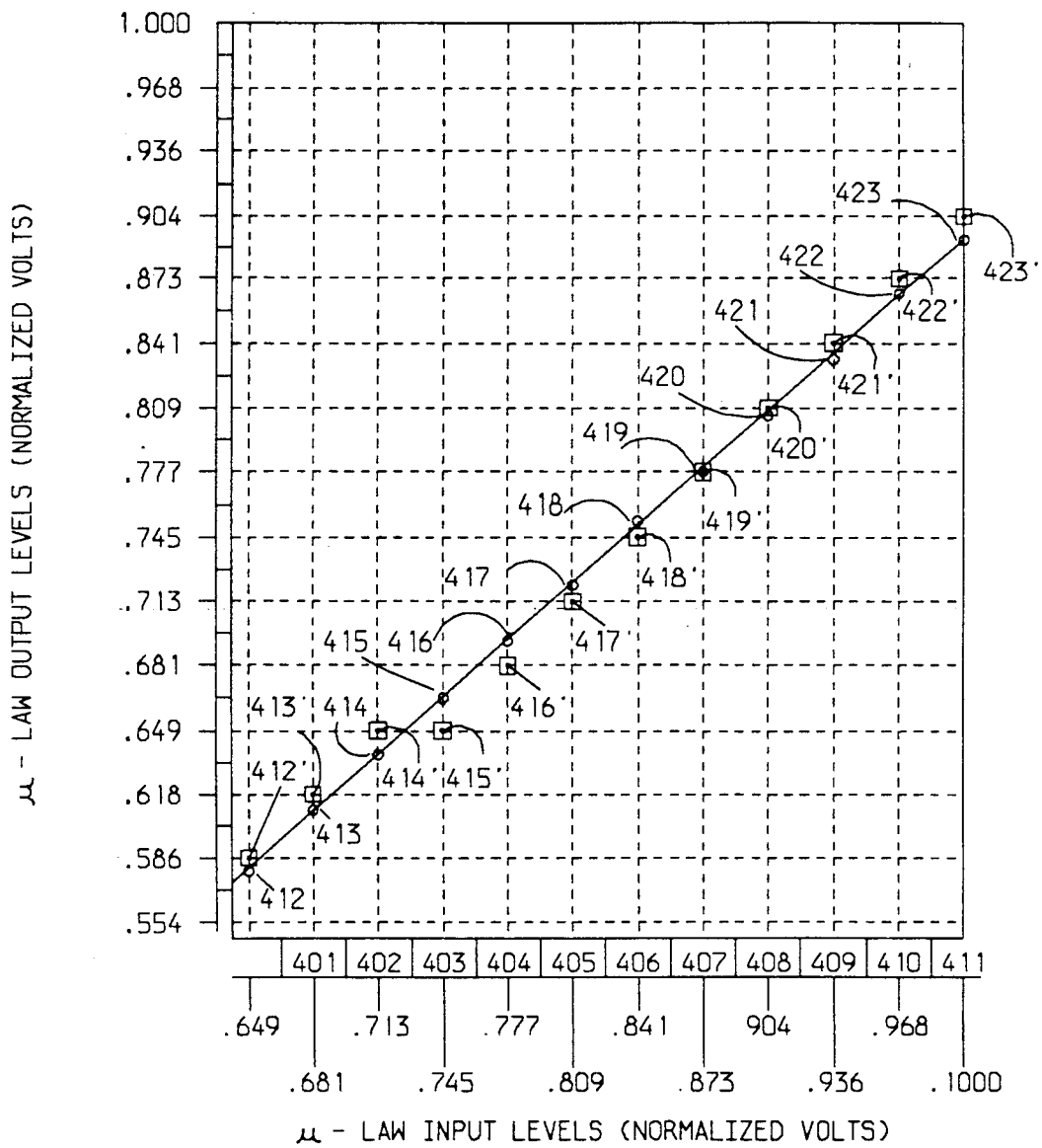
FIG. 3 is a graph which illustrates the unpredictable nature of the additional quantization error caused by the digital gain or loss pad of FIG. 1 for a portion of the transfer function provided by a $\mu$-law encoder.

FIG. 3 illustrates the unpredictable nature of the additional quantization error. The horizontal axis of FIG. 3 shows 11 non-overlapping and contiguous intervals, 401–411, for a portion of a $\mu$-law A/D converter. The decimal numbers on the X axis indicate the mean of the limits of each interval in normalized volts. The output level for each of the input intervals is plotted on the Y axis in normalized volts and is aligned with a dotted horizontal line. The points 412–423 indicate the digital signal representation that exactly corresponds to the insertion of a 1 dB loss to the $\mu$-law output level for each input signal interval. These points all lie on a straight line. The points 412' through 423', each surrounded by a square, show the signal level to which each of the output levels 412–423, respectively, will be quantized. Accordingly, the separation between any numbered point and the prime version of this number represents the additional quantization error being introduced by the insertion of a 1 dB loss. Note that there is virtually no additional quantization error introduced for analog input sample amplitudes falling in interval 407, as points 419 and 419' are substantially aligned to one another. However, significant quantization error is introduced for analog signal sample amplitudes falling in most of the other intervals, as there is a noticeable separation between a given point and its primed equivalent, e.g., 414 and 414', 415 and 415', and 423 and 423'.

The relationship between quantization levels that I propose, in accordance with the present invention, can be expressed as:

$$y_{n+1} = k y_n \tag{1}$$

where k is a predetermined scalar quantity, y is a quantization level and the subscript n is an index indicating any quantization level so that the subscript n+1 is associated with the quantization level immediately following any given quantization level in the ordered set of all such levels.

Equation (1) defines the relationship between the quantization levels. Each such level is associated with one digital signal that is transmitted in a communications network. The apparatus which incorporates the relationship of equation (1) can be an A/D converter, in which case each quantization level is associated with one of the digital output signals of the A/D converter. Or, alternatively, the quantization levels can be associated with digital signals which are supplied to a coding device which maps each digital signal into another digital signal. Examples of such use would be for converting from digital signals incorporating any quantization level relationship, e.g., $\mu$ or A-law coding, to digital signals representing the quantization level relationship of equation (1). In other potential applications, the situation is reversed and the quantization levels are associated with the input to the signal conversion device. Such a device could be a D/A converter or a digital-to-digital coder. For the D/A converter, digital signals representing the relationship of equation (1) are transformed into an analog waveform, while in the digital-to-digital converter, digital signals incorporating the relationship of equation (1) are converted into any other format, e.g., $\mu$ or A-law.

As discussed, the value of k in equation (1) should be chosen so that any necessary dB loss or gain is a multiple of the scaling factor. For example, equation (1) can be written as $$\log\left(\frac{y_{n+1}}{y_n}\right) = \log k \tag{2}$$

where log denotes a logarithm to the base 10. Multiplying equation (2) by 20 yields $$20 \log\left(\frac{y_{n+1}}{y_n}\right) = \text{dB losses or gains expressing a} \tag{3}$$

voltage or current ratio = $20 \log k$

Accordingly, k=1.05925 corresponds to intervals of 0.5 dB. With k=1.05925, providing any dB loss or gain which is a multiple of 0.5 dB is accomplished by respectively counting up or counting down a number of quantization levels from the quantization level represented by the existing digital signal. Each quantization level counted represents a 0.5 dB increment. Equivalently, for desired dB losses or gain expressing a power ratio, the 20 in equation (3) should be changed to 10 before solving for k.

For the case of an A/D converter incorporating the relationship of equation (1), the relationship between the analog input signal amplitude intervals is arbitrary. Preferably, such intervals should be contiguous and non-overlapping. One relationship which is desirable can be expressed as $$(y_n y_{n-1})^{\frac{1}{2}} < x_n < (y_n y_{n+1})^{\frac{1}{2}} \tag{4}$$

that is, any interval $x_n$ which is represented by quantization level $y_n$ extends from a lower limit of $(y_n y_{n-1})^{\frac{1}{2}}$ an upper limit of $(y_n y_{n+1})^{\frac{1}{2}}$.

It should be noted that the relationships defined by equations (1) and (4) are dissimilar to those which represent either $\mu$ or A-law. For example, for $\mu$ law, the n+1$^{th}$ quantization level, where n is any level, is expressed by $$y_{n+1} = \frac{1}{2}(X_n + X_{n+1}) \tag{5}$$

where $X_n$ and $X_{n+1}$ are the upper and lower limits of the analog signal amplitude interval associated with quantization level $Y_{n+1}$. Furthermore, $$X_{n+1} = X_n + k, \tag{6}$$

where k is a scalar constant that differs for each range of 16 values of n. In other words, in $\mu$ law, the quantization level associated with an input interval is the arithmetic mean of the boundary limits for that interval. As a result, the quantization levels in μ law are linearly related to one another. In contrast, in the present invention, the logarithm of any quantization level is equal to the logarithm of the immediately preceding quantization level in the ordered set of such levels plus a constant. This follows by taking the logarithm of both sides of equation (1). In addition, equation (4) defines the lower boundary of any given input interval as the geometric mean of the quantization level for that interval and the quantization level of the immediately preceding interval. The upper boundary for this arbitrary input interval is defined as the geometric means of the quantization level for this interval and the quantization level for the immediately following interval.

Figure 4:
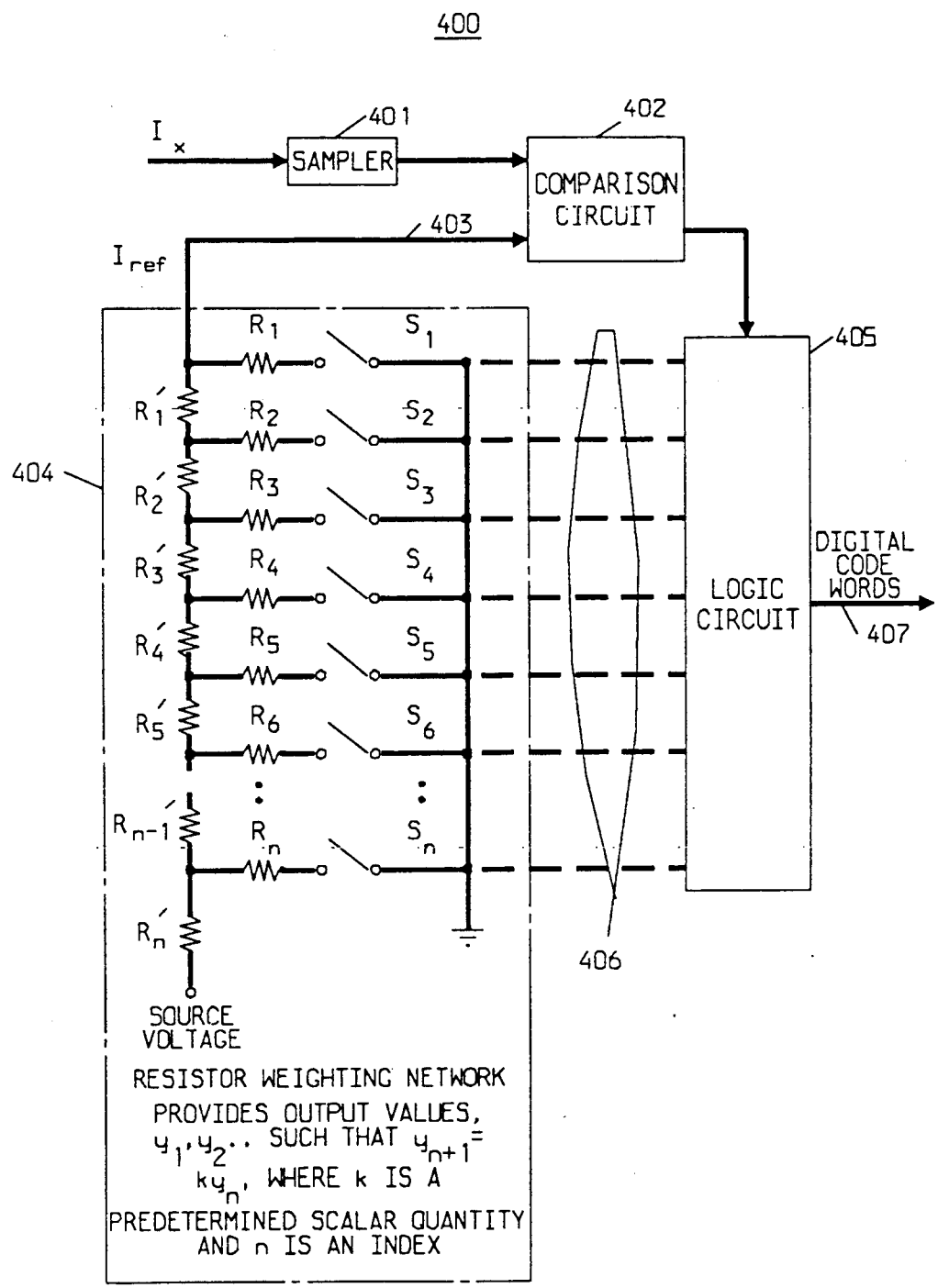
FIG. 4 is a block-schematic diagram of analog-to-digital signal conversion appartus which incorporates the present invention.

Refer now to FIG. 4, which shows an exemplary A/D digital coder which incorporates the present invention. A/D converter 400 is of the well-known successive approximation type wherein the assignment of each sample of an analog signal is assigned a corresponding M-bit digital code word, where M is a predefined integer. In this type of A/D converter, the code word assignment is accomplished by a succession of comparisons of each sample value using a different decision level for each comparison.

As shown, A/D converter 400 includes a sampler 401, which samples the input analog waveform $I_x$ and couples each sample to comparison circuit 402. Circuit 402 compares each sample to a decision level $I_{ref}$ appearing on lead 403 and generated by resistor weighting network 404. For each comparison, comparison circuit 402 provides a binary output signal indicative of whether the sample value is above or below $I_{REF}$. Logic circuit 405 receives the binary output and directs the next decision supplied to comparison circuit 402 by controlling switches $S_1$ through $S_n$ within resistor weighting network 404 via bus 406. The operation of each of these switches alters the reference signals in a predetermined way by adding or subtracting resistors $R_1$ through $R_n$ in a ladder network so that successive comparisons progressively decrease the number of possible assigned digital code words until only one such code word remains. When this occurs, the one remaining code word is outputted on lead 407. This outputted code word is the one associated with the quantizing level closest in value to that of the analog signal sample. The bit representation of each code word can be arbitrary. It is preferable, however, if the bit representations of all code words are assigned in an ordered manner, such as by using two's complement mathematics.

As is also known, in order to determine the code word associated with the quantizing level closest in value to that of the analog signal sample, each quantizing level is associated with a pair of decision levels. Each pair of decision levels straddle a quantizing level as shown in FIG. 2. In accordance with the present invention, the set of quantizing levels associated with the set of code words follows the relationship of equation 1, i.e., each quantizing level is equal to the immediately preceding quantizing levels time a scalar quantity k. Any set of decision level values may be used so long as a pair of decision levels straddle each quantizing level and there is only one decision level between any adjacent quantizing levels. To reduce errors in assignment, however, it is preferable for the decision levels to be located midway between the quantizing levels. Accordingly, it is also preferable if the set of decision levels also follows the relationship of equation 1. In other words, if one were to assemble all the decision levels and arrange them in order of increasing value, each decision level after the first would be equal to the preceding decision level times the same scalar quantity k. One way of providing such a relationship between decision levels is to design resistor weighting network 404 with resistor values such that the relationship of equation 1 is followed. Given the relationship of equation 1, the determination of the appropriate resistor values is well-known.

Figure 5:
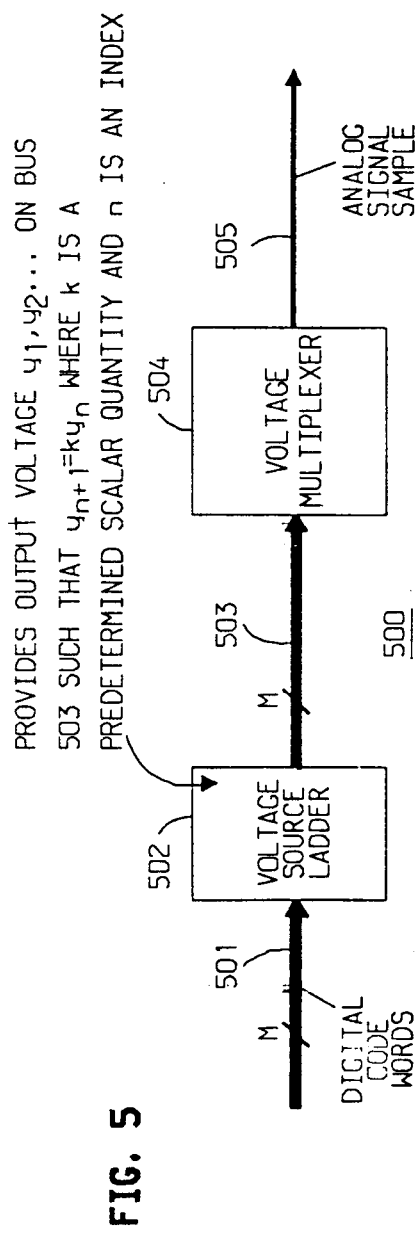
FIG. 5 is a block-schematic diagram of digital-to-analog signal conversion apparatus which incorporates the present invention.

Refer now to FIG. 5 which shows a D/A converter which embodies the present invention. D/A converter 500 receives the M-bit code words previously generated by converter 400 on bus 501 and couples the same to voltage source ladder 502. This ladder, in well-known fashion, outputs an associated voltage in response to the appearance of specific logic state on each lead of bus 501. These voltages appear on bus 503 and are combined by multiplier 504 to form an analog signal sample on lead 505. Each analog signal sample is associated with one of the received M-bit digital code words on bus 501 and, more specifically, each of the analog signal samples has a value equal to the quantizing level associated with each code word in the A/D converter. To incorporate the present invention, one merely designs the voltage source ladder, in a well-known manner, so that the set of all analog signals samples follows the relationship of equation 1.

Figure 6:
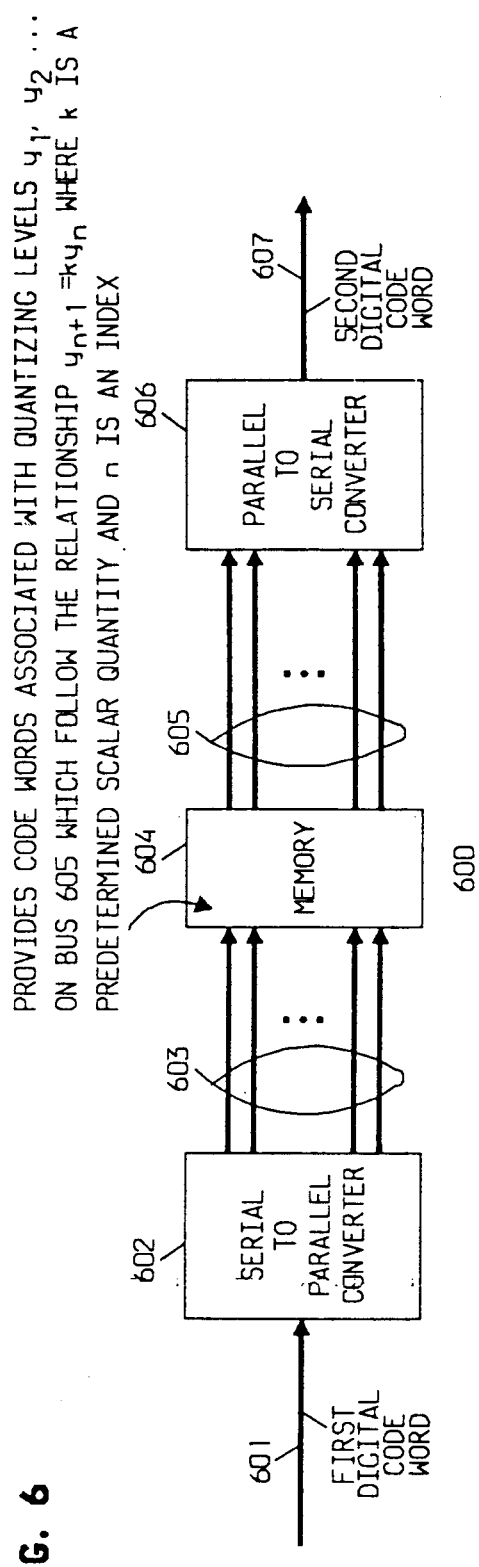
FIG. 6 is a block-schematic diagram of digital-to-digital signal conversion apparatus which incorporates the present invention.

FIG. 6 shows a digital-to-digital converter which transforms a first digital signal associated with a first set of quantizing levels to a second digital signal associated with a second set of quantizing levels. What is contemplated here is the ability to convert between digital code words associated with a well-known set of quantizing levels, such as μ or A-law, to code words associated with a set of quantizing levels which all follow the relationship of equation 1, hereinafter referred to as dB law. This device can operate to transform code words associated with any previously known set of quantizing levels to dB law and vice versa.

Digital-to-digital converter 600 includes serial-to-parallel converter 602, memory 604 and parallel-to-serial converter 606. The M-bits of each first digital code word appearing on lead 601 are converted into a parallel array by serial-to-parallel converter 602 and appear on address 603 of memory 604. Memory 604 stores a look-up table in which the second digital code word associated with each first digital code word is stored. These second digital code words are read out of memory in response to each address and are coupled via bus 605 to parallel-to-serial converter 606. A serial stream of second code words, one for each first digital word, are outputted by parallel-to-serial converter 606 and appear on lead 607.

Determining the second code word stored in memory 604 that corresponds to each first code word can be accomplished by comparing the quantizing levels associated with each first code word to quantizing levels associated with the second code words. For each quantizing level associated with a first code word, one merely choses one quantizing level closest in value from among those associated with second code words. The second code word associated with this chosen quantizing level is then stored in the memory. This type of conversion between digital signals will produce quantizing errors. It has been found, however, that in converting between dB law and other formats, this error can be reduced by an appropriate choice of k. For example, for conversion between μ-law and dB law, quantization errors can be reduced if an interval of 3.008 dB is set between adjacent positive quantizing levels 1 through 6; 0.762 dB between adjacent positive quantizing levels 7 through 30; and 0.376 dB between adjacent positive quantizing levels 31 through 127. For A-law, quantization errors can be reduced if the interval is set at 3.008 dB between adjacent positive quantizing levels 1 through 7; 0.762 dB between adjacent positive quantizing levels 8 through 16; and 0.376 dB between adjacent positive quantizing levels 16 through 128. Digital loss values of 0.376 and multiples thereof will not change signal distortion for output levels 0 to 30 dB less than maximum with μ-law to dB law conversion and will not change signal distortion for levels 0 to 36 dB less than maximum with A-law to dB law conversion.

We have shown that the use of dB law provides a remarkable improvement in signal distortion for input signals 35 to 64 dB below maximum and makes possible the employment of digital loss or gain without additional signal distortion impairment. In addition, with dB law the required gain or loss can be provided by straightforward digital addition or subtraction. Presently, with μ- or A-law, the process entails a conversion from 8 bits to 14 bits to provide accuracy in rounding off, followed by multiplication for digital gain insertion and division for digital loss insertion.

It should, of course, be understood that while the present invention has been described in terms of several disclosed embodiments, other arrangements should be apparent to those of ordinary skill in the art. For example, while specific structures for A/D and D/A converters and a digital-to-digital coder has been disclosed, the present invention can be embodied in a variety of converter and coder structures, including, for example, digit-at-a-time, word-at-a-time and level-at-a-time devices.

What is claimed is:

1. Signal conversion apparatus comprising
   means for receiving input signals, each input signal having a value falling within one of a plurality of input signal ranges; and
   means for associating the range corresponding to each received input signal value with an output signal whose value is different for each of said plurality of ranges, all of the output signal values corresponding to said plurality of input signal ranges forming an ordered set, any one output signal value that follows a first output signal value in said set being equal to the immediately preceding output signal value multiplied by a predetermined factor, said factor having one value for at least three consecutive output signal values in said set.

2. The apparatus of claim 1 wherein each of said plurality of input signal ranges has upper and lower limits and each upper and lower limit is a geometric means of two consecutive output signal values.

3. The apparatus of claim 1 wherein said predetermined factor has said one value for all output signal values in said ordered set.

4. The apparatus of claim 1 wherein said predetermined factor has different values for different subsets of said ordered set, each subset including at least three consecutive output signal values in said set.

5. The apparatus of claim 4 wherein said different values of said predetermined factor are multiples of one of said different values.

6. The apparatus of claim 1 wherein said one value of said predetermined factor is selected so that any two consecutive output signal values in said set differ from one another by a preselected decibel quantity.

7. The apparatus of claim 1 wherein said plurality of input signal ranges are contiguous and non-overlapping.

8. The apparatus of claim 1 wherein each input signal is a sample of an analog signal and each output signal is a digital signal, each input signal value being the value of the amplitude of said sample and each output signal value being one value in a predetermined array of input signal amplitude values.

9. The apparatus of claim 1 wherein each input signal is a digital signal and each output signal is a sample of an analog signal, each input signal value being one value in a predetermined array of input signal amplitude values.

10. The apparatus of claim 9 wherein the input signal values are coded in accordance with μ-law.

11. The apparatus of claim 9 wherein the input signal values are coded in accordance with A-law.

12. The apparatus of claim 1 wherein each input and each output signal is a digital signal.

13. The apparatus of claim 12 wherein the input signal values are coded in accordance with μ-law.

14. The apparatus of claim 12 wherein the input signal values are coded in accordance with A-law.

15. A signal conversion method comprising the steps of
   receiving input signals, each input signal having a value falling within one of a plurality of input signal ranges; and
   associating the range corresponding to each received input signal value with an output signal whose value is different for each of said plurality of ranges, all of the output signal values corresponding to said plurality of input signal ranges forming an ordered set, any one output signal value that follows a first output signal value in said set being equal to the immediately preceding output signal value multiplied by a predetermined factor, said factor having one value for at least three consecutive output signal values in said set.

16. A signal conversion method comprising the steps of
   receiving input signals, each input signal having a value; and
   associating each input signal value with an output signal value wherein each output signal value falls within one of a plurality of output signal ranges and each input signal value is different for each of said plurality of ranges, all of the input signal values corresponding to said plurality of output signal ranges forming an ordered set, any one input signal value that follows a first input signal value in said set being equal to the immediately preceding input signal value multiplied by a predetermined factor, and said factor having one value for at least three consecutive input signal values in said set.

17. The apparatus of claim 1 wherein said apparatus is utilized in a telecommunications circuit wherein signal gain/loss is provided in multiples of a predetermined decibel quantity and said predetermined factor is a function of said decibel quantity.

* * * * *